United States Patent
Laifenfeld et al.

(10) Patent No.: US 9,777,715 B2
(45) Date of Patent: Oct. 3, 2017

(54) APPARATUS FOR COST EFFECTIVE WIRELESS ACTUATOR USING SMA AND MRC

(71) Applicant: GM GLOBAL TECHNOLOGY OPERATIONS LLC, Detroit, MI (US)

(72) Inventors: Moshe Laifenfeld, Haifa (IL); Vladimir Suplin, Modiin (IL)

(73) Assignee: GM Global Technology Operations LLC, Detroit, MI (US)

(*) Notice: Subject to any disclaimer, the term of this patent is extended or adjusted under 35 U.S.C. 154(b) by 206 days.

(21) Appl. No.: 14/597,143

(22) Filed: Jan. 14, 2015

(65) Prior Publication Data
US 2016/0201655 A1 Jul. 14, 2016

(51) Int. Cl.
| | | |
|---|---|---|
| H02N 10/00 | (2006.01) |
| F03G 7/06 | (2006.01) |
| H01F 38/14 | (2006.01) |
| H02J 50/12 | (2016.01) |
| G01R 35/00 | (2006.01) |
| B23Q 15/00 | (2006.01) |
| B60L 11/18 | (2006.01) |
| G01R 27/02 | (2006.01) |

(52) U.S. Cl.
CPC .......... F03G 7/065 (2013.01); H01F 38/14 (2013.01); H02J 50/12 (2016.02); *B23Q 15/00* (2013.01); *B60L 11/182* (2013.01); *F03G 7/06* (2013.01); *G01R 27/02* (2013.01); *G01R 35/005* (2013.01); *Y02T 90/14* (2013.01)

(58) Field of Classification Search
CPC F03G 7/06; F03G 7/065; B23Q 15/00; B81B 3/0024; B81B 2201/018; B60L 11/1824; B60L 11/005; B60L 11/182; Y02T 10/7241; Y02T 10/7022; Y02T 90/14; Y02T 90/127; Y02T 90/122; Y02T 90/12; Y02T 90/121; H01P 38/14; G01R 35/005; G01R 27/02
USPC ......................................................... 318/117
See application file for complete search history.

(56) References Cited

U.S. PATENT DOCUMENTS

| | | | | |
|---|---|---|---|---|
| 5,170,801 A | * | 12/1992 | Casper .................. | A61B 5/073 600/582 |
| 8,220,259 B1 | * | 7/2012 | Cripe ..................... | F03G 7/065 310/306 |
| 2010/0277121 A1 | * | 11/2010 | Hall ...................... | B60L 11/182 320/108 |
| 2012/0169137 A1 | * | 7/2012 | Lisi ........................ | H02J 5/005 307/104 |

(Continued)

*Primary Examiner* — Kawing Chan
*Assistant Examiner* — Bradley Brown
(74) *Attorney, Agent, or Firm* — John A. Miller; Miller IP Group, PLC

(57) ABSTRACT

A system and method for wirelessly controlling a shape memory alloy (SMA) actuator using magnetic resonant coupling (MRC). The SMA actuator is part of a receiver circuit including an actuator coil, where the SMA actuator is configured into a certain shape. The system includes a transmitter circuit having a transmitter coil and a controller, where the transmitter coil receives an AC current that causes the transmitter coil to generate an oscillating magnetic field in resonance with the actuator coil in the receiver circuit and be magnetically coupled thereto. The current induced in the actuator coil creates heat that reconfigures the SMA actuator to provide the actuation.

16 Claims, 2 Drawing Sheets

(56) References Cited

U.S. PATENT DOCUMENTS

2012/0217819 A1* 8/2012 Yamakawa ............ B60L 11/182 307/104
2014/0111023 A1* 4/2014 Kagami ................ B60L 11/182 307/104

* cited by examiner

APPARATUS FOR COST EFFECTIVE WIRELESS ACTUATOR USING SMA AND MRC

BACKGROUND OF THE INVENTION

Field of the Invention

This invention relates generally to a system and method for wirelessly controlling a shape memory alloy (SMA) actuator and, more particularly, to a system and method for wirelessly controlling an SMA actuator using magnetic resonant coupling (MRC).

Discussion of the Related Art

Many modern systems employ sensors, actuators, controllers, sub-systems, buses, etc. that require electrical wiring to operate the devices. As the number active systems increases, so does the wiring necessary to support those systems. However, there are a number of disadvantages with providing wires, especially many wires. For example, in a vehicle, the electrical conductor of the wires, such as copper, has significant weight. As the weight of a vehicle increases, fuel efficiency decreases. Further, wiring in a vehicle is susceptible to damage, which increases the warranty cost of the vehicle. Also, requiring wiring throughout the vehicle reduces the flexibility in design and manufacturing of the vehicle. Further, at least some of the wiring in a vehicle often requires periodic maintenance. Also, wiring adds significant expense and cost. Further, during manufacture of the vehicle, assembly of cable harnesses often causes problems as a result of breaking or bending of connector pins. Therefore, it would be desirable to eliminate or reduce the wiring in a vehicle.

Shape memory alloys (SMA), such as nickel-titanium (NiTi) alloys, known generally as Nitinol, are well known alloys in the art. An SMA can go through a phase change while it remains a solid, known as martensite and austenite phases. When the SMA is below a transition temperature that is defined by the particular alloy, the SMA is in the martensite phase, where depending on its size and shape can be conformed to a particular configuration and remain in that shape. When the SMA is heated above the transition temperature, such as by an electrical current, the SMA will go from the martensite phase to the austenite phase, which causes it to return its original or "parent" configuration. The SMA will remain in the parent configuration after the heat is removed unless forced into another configuration.

SUMMARY OF THE INVENTION

The present disclosure describes a system and method for wirelessly controlling a shape memory alloy (SMA) actuator using magnetic resonant coupling (MRC). The SMA actuator is part of a receiver resonant circuit including an actuator coil and a capacitor, where the SMA actuator is configured into a certain shape. The system includes a transmitter circuit having a transmitter coil and a controller, where the transmitter coil receives an AC current that causes the transmitter coil to generate an oscillating magnetic field in resonance with the actuator coil in the receiver circuit and be magnetically coupled thereto. The current induced in the actuator coil flows in the SMA actuator that in turn generates heat that reconfigures the SMA actuator to provide the actuation.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for wirelessly controlling a shape memory alloy (SMA) actuator using magnetic resonant coupling (MRC) is merely exemplary in nature, and is in no way intended to limit the invention or its applications or uses. For example, the present invention has particular application for SMA actuators on a vehicle. However, as will be appreciated by those skilled in the art, the SMA actuator and related system of the invention as described herein may have application in many other industries, such as the aerospace industry.

The present invention proposes a system and method for wirelessly actuating an SMA actuator through magnetic resonant coupling (MRC). As is well understood by those skilled in the art, magnetic resonant coupling provides a quasi-static magnetic field between two or more coils, where the coils are tuned to resonate at the same resonant frequency. An alternating current is provided on one of the coils, which generates an oscillating magnetic field. The oscillating magnetic field is received by the other coil that induces an oscillating current in that coil. The current induced in the other coil flows in the SMA actuator that in turn generates heat that reconfigures the SMA actuator to provide the actuation.

Figure 1:
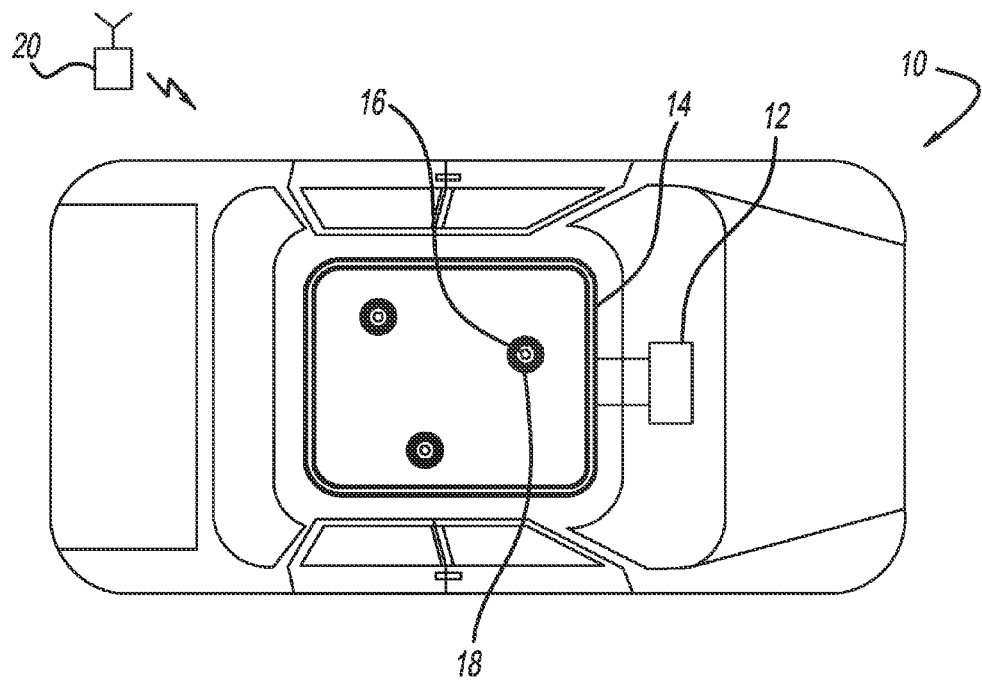
FIG. 1 is a top view of a vehicle including a transmitter coil and a plurality of wireless SMA actuators.

FIG. 1 is a top view of a vehicle 10 including an electronic control unit (ECU) 12 for a particular sub-system of the vehicle 10, such as an engine controller. A base coil 14, sometimes referred to herein as a transmitter coil, is embedded in the vehicle 10 at a desired location, and is responsive to an AC signal from the ECU 12 to generate an oscillating magnetic field. In this non-limiting embodiment, and as will be discussed in detail below, the ECU 12 through the coil 14 controls a number of SMA actuators 16, each including an actuator coil 18, through magnetic resonant coupling. Particularly, the base coil 14 is controlled to selective resonant at a particular frequency and produce an oscillating magnetic field that is tuned to one or more of the coils 18 at any particular point in time that can then be used to actuate the actuator 16. In other words, the ECU 12 can be tuned to a number of the actuators 16, where each of the actuators 16 has a different resonant frequency and is actuated separately by the ECU 12. In order to provide the most efficient transfer of energy from the base coil 14 to the actuator coils 18, it is desirable, but not necessary, that all of the SMA actuators 16 be positioned within the coil 14, and preferably on the same plane as the coil 14.

The SMA actuators 16 discussed herein provide the potential for replacing costly actuators currently on vehicles, such as solenoids. An SMA actuator can be made relatively cheap, with high reliability, low weight, low noise operation and with no mechanical parts. Because the SMA actuators 16 are wireless and sensorless, there are many applications where such an actuator can be employed that do not readily allow wire installation, such as aggressive environments in hydraulic lines and tanks, and other hermetically sealed environments. Potential applications for an SMA actuator of the type discussed herein include vehicle ventilation flap control, fan control, wireless side mirrors, cup holder latch, etc. Further, an SMA actuator can replace actuators with sliding contacts, such as fans, power seats, etc. Also, SMA actuators can be distributed to morph into interior features, for healing of structures, haptic feedback, etc.

Because of the size, weight and other requirements of the base coil 14, it may be desirable to remove the base coil 14 from the vehicle 10 for some applications. In an alternate embodiment, a portable transmitter 20 including a transmitter coil and suitable circuitry as described herein is provided separate from the vehicle 10 to control the actuators 16.

Figure 2:
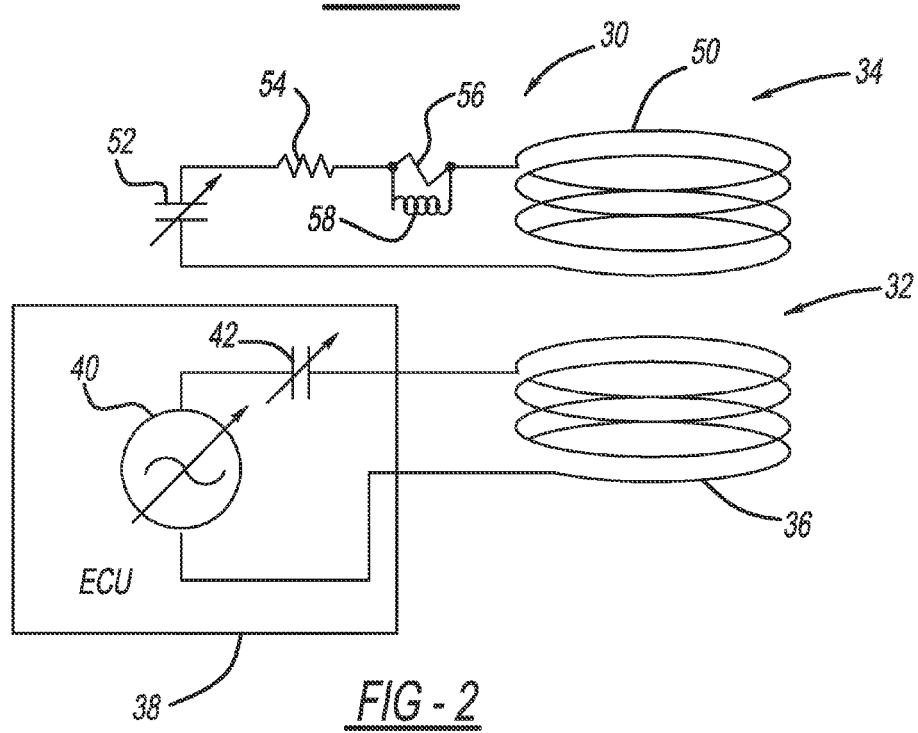
FIG. 2 is a schematic diagram of a magnetic resonant coupling circuit including a wireless power transmitter circuit having a transmitter coil and a receiver circuit having an SMA actuator.

FIG. 2 is a schematic diagram of an MRC circuit 30 including a transmitter circuit 32 and an actuator or receiver circuit 34. The transmitter circuit 32 includes a base coil 36 and a controller or ECU 38. The ECU 38 includes a variable current source 40 that provides an alternating current (AC) that is tuned by a variable tuning capacitor 42, which causes the coil 36 to generate an oscillating magnetic field at a particular frequency. The source 40 and the variable capacitor 42 can be selectively controlled by the ECU 38 to provide different drive frequencies so that the base coil 36 can be tuned to multiple resonant frequencies. In one non-limiting embodiment, the ECU 38 can employ pulse width modulation (PWM) to vary the frequency of the current provided by the source 40, which changes the resonant frequency of the coil 36.

The receiver circuit 34 includes an actuator coil 50 on which is induced a current in response to the oscillating magnetic field received from the base coil 36 through magnetic resonant coupling as described herein. The current generated by the coil 50 can be detected by the transmitter circuit 32 as discussed herein. As the magnetic field oscillates, the actuator coil 50 generates an AC signal, which is tuned to a particular resonant frequency by a tuning capacitor 52, so that the resonant frequency of the coil 50 provides strong magnetic coupling with the base coil 36 when the oscillating magnetic field is at the tuned frequency of the coil 50. The receiver circuit 34 also includes an SMA actuator 56 and a spring 58, or some other suitable bias device, where the spring 58 holds or configures the actuator 56 in a certain position while the SMA actuator 56 is in its martensite phase. A load resistor 54 depicts the active resistance of the SMA actuator. In another embodiment discussed below, the SMA actuator is the coil 50. The current flow through the coil 50 as a result of the magnetic resonant coupling with the coil 36 also flows through the SMA actuator 56, which causes the actuator 56 to increase in temperature above the transition temperature of the particular alloy, which causes the actuator 56 to go into its austenite phase and return to its memory or parent configuration against the bias of the spring 58. Without the spring 58, the actuator 56 would remain in its parent configuration after the heat is removed. Operation of a shape memory alloy in this manner is well understood by those skilled in the art in response to a control current.

The change in the shape or length of the SMA actuator 56 when it goes to its memory position may alter the resonant frequency of the coil 50, which is detected by the ECU 38 through the magnetic coupling with the coil 36. More particularly, the SMA actuator 56 will change the reflected impedance of the receiver circuit 34 on the transmitter circuit 32. If the coil 50 is made of a shape memory alloy, then this change causes a change in the inductance of the coil 50, and thus a change in its resonance frequency. The ECU 38 can change the frequency of the source 40 and/or vary the capacitance of the capacitor 42 to adjust the oscillating frequency of the coil 36 to the new resonant frequency of the receiver circuit 34 so as to maintain the actuator 56 in the actuated position in response to such changes in the resonant frequency of the coil 50. The transmitter circuit 32 can be calibrated so as to provide a simple control of the resonant frequency that translates directly to the length of the SMA actuator 56. Fine tuning control of the SMA actuator 56 can be provided as will be discussed in further detail below, where possibly a position sensor, such as an encoder, may be required.

As long as the magnetic coupling between the coils 36 and 50 is maintained, the SMA actuator 56 will stay in its memory position. When the current is removed as a result of the coil 36 being tuned to another resonant frequency or turned off, the bias of the spring 58 will return the SMA actuator 56 to its home position or configuration. In this way, the actuator 56 is able to provide actuation of a certain device. The shape of the actuator 56 can be designed in any suitable manner for any particular device.

The discussion above talks about the combination of the inductance provided by the coil 50, the resistance provided by the load 54 and the capacitance provided by the capacitor 52 as defining the resonant frequency of the receiver circuit 34. In alternate embodiments, the SMA actuator 56 could have one, two or all of those properties for a particular actuator design possibly limiting the number of components in the receiver circuit 34.

Figure 3:
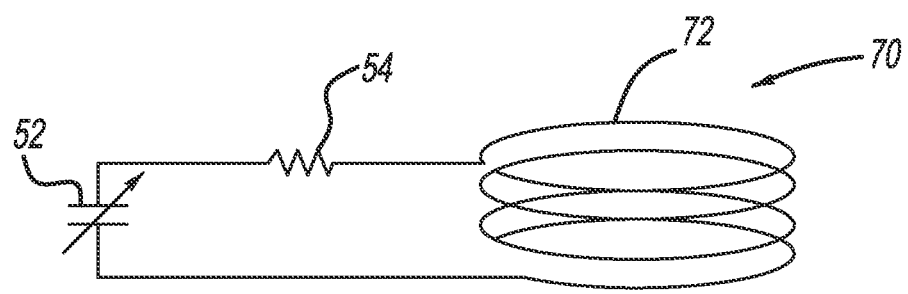
FIG. 3 is a schematic diagram of a receiver circuit for a magnetic resonant circuit including an SMA actuator coil and a capacitor.

For example, in an alternate embodiment, the coil 50 itself can be the SMA actuator that changes shape, such as contracts or changes length, when the current induced by the magnetic resonant coupling flows therethrough. FIG. 3 is a schematic diagram of a receiver circuit 70 similar to the receiver circuit 34, where like elements are identified by the same reference number, showing this embodiment. In the receiver circuit 70, the coil 50 is replaced with an SMA actuator coil 72 that provides the inductive coupling and is made of a suitable shape memory alloy. When the shape or length of the coil 72 changes in response to the heat generated by the current flow therethrough, the magnetic properties of the coil 72 change, and thus, the magnetic coupling between the coils 36 and 72 may be decreased or lost. Thus, the transmitter circuit 32 may need to detect this change and change the oscillating frequency of the coil 36 as discussed above. The transmitter circuit 32 can maintain the SMA actuator at a particular length, and therefore fine tuning of the SMA actuator can be achieved.

Figure 4:
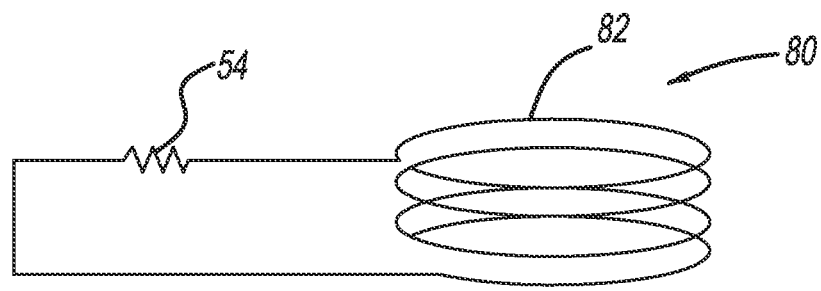
FIG. 4 is a schematic diagram of a receiver circuit for a magnetic resonant circuit including an SMA actuator coil.

FIG. 4 is a schematic diagram of a receiver circuit 80 similar to the receiver 34, where like components are identified by the same reference number. In this design, not only is the SMA actuator configured as a coil 82 to provide the necessary inductance, the parasitic capacitance provided by the actuator coil 82 also provides the capacitance necessary for the magnetic coupling.

The SMA actuator 56 can be fined tuned as discussed above based on resistance, resonance frequency, phase of reflected impedance of the receiver circuit and/or power by the ECU 38 as follows. The impedance of the equivalent circuit is defined as:

$$Z_L = \frac{w^2 M^2}{R_{SMA} + j\frac{w^2 L_R C_R - 1}{w C_R}}, \quad (1)$$

where:

$$M = \kappa \sqrt{L_T L_R}, \quad (2)$$

and where $\kappa$ is a coupling factor, Z is the impedance, $L_T$ is the inductance of the coil 36, $L_R$ is the inductance of the coil 50, $C_T$ is the capacitance of the capacitor 42, $C_R$ is the capacitance of the capacitor 52, and $R_{SMA}$ is the resistance of the actuator 56.

If $w^{-1} = \sqrt{L_R C_R} = \sqrt{L_T C_T}$ and the voltage $V_L$ across the coil 36 is monitored, the resistance $R_{SMA}$ can be sensed or its difference determined as:

$$R_L = w^2 M^2 / R_{SMA}. \quad (3)$$

If $L_{SMA}(/\text{nom}) = L_R$, then the phase of the voltage $V_T$ across the coil 32 is a function of length and resistance as:

$$Z_L = \frac{w^2 M^2}{R_{SMA} + jw\Delta L_{SMA}}, \quad (4)$$

$$\angle V_T = -\operatorname{atan}\frac{w\Delta L_{SMA}}{R_{SMA}}. \quad (5)$$

A phase-lock loop (PLL) can extract the phase which, for example in the case of a round coil has a square relation to diameter of the coil 50, as:

$$L = K \times \mu_0 \times N^2 \pi \times D^2 / 4l, \quad (6)$$

$$\frac{w\Delta L_{SMA}}{R_{SMA}} = \frac{wK(D_{nom} + \Delta D)^2}{R_{SMA}}. \quad (7)$$

By compensating the resonant frequency a pure resistive impedance can be reached. Therefore, controlling $V_{ref}$ is translated directly to a change in the length of the SMA actuator 56, where:

$$\alpha' = f(K, C_R, VCO \text{ gain}), \quad (8)$$

$$V_{ref} = V_{nom} + \Delta V = \alpha \sqrt{\frac{1}{\Delta L_{SMA}}} = \alpha' \frac{1}{D_{nom} + \Delta D}. \quad (9)$$

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A magnetic resonant coupling (MRC) actuation circuit comprising:
    a transmitter circuit including a controller, a base coil, a variable current source and a tuning capacitor, said variable current source selectively providing a predetermined alternating current to the base coil in combination with a capacitance provided by the tuning capacitor so as to generate an oscillating magnetic field at a predetermined frequency; and
    at least one receiver circuit including a shape memory alloy (SMA) actuator and an actuator coil, said controller selectively providing the frequency of the oscillating magnetic field to be tuned to the actuator coil through MRC so as to heat the SMA actuator and cause it to change its configuration,
    where the controller adjusts the transmitter circuit to fine tune the oscillating magnetic field, based on a change of phase of reflected impedance of the receiver circuit, when the SMA actuator changes its configuration.

2. The MRC circuit according to claim 1 wherein the receiver circuit includes a variable capacitor in electrical communication with the SMA actuator and the actuator coil, said SMA actuator operating as a resistive load in the at least one receiver circuit.

3. The MRC circuit according to claim 1 wherein the SMA actuator operates both as an inductor and a parasitic capacitance in the receiver circuit.

4. The MRC circuit according to claim 1 wherein the at least one receiver circuit is a plurality of receiver circuits, wherein the controller changes the frequency of the oscillating magnetic field to be selectively tuned to all of the receiver circuits.

5. The MRC circuit according to claim 1 wherein the MRC circuit is a vehicle circuit and the actuator is a vehicle actuator.

6. The MRC circuit according to claim 5 wherein the transmitter circuit is separate from the vehicle and the receiver circuit is on the vehicle.

7. A magnetic resonant coupling (MRC) actuation circuit comprising:
    a transmitter circuit including a controller, a base coil, a variable current source and a tuning capacitor, said variable current source selectively providing a predetermined alternating current to the base coil in combination with a capacitance provided by the tuning capacitor so as to generate an oscillating magnetic field at a predetermined frequency; and
    a receiver circuit including a shape memory alloy (SMA) actuator being configured as an actuator coil, said controller selectively providing the frequency of the oscillating magnetic field to be tuned to the actuator through MRC so as to heat the actuator and cause it to change its configuration,
    where the controller adjusts the transmitter circuit to fine tune the oscillating magnetic field, based on a change of phase of reflected impedance of the receiver circuit, when the SMA actuator changes its configuration.

8. The MRC circuit according to claim 7 wherein the receiver circuit includes a variable capacitor in electrical communication with the SMA actuator.

9. The MRC circuit according to claim 7 wherein the SMA actuator operates both as an inductor and a parasitic capacitance in the receiver circuit.

10. The MRC circuit according to claim 7 wherein the MRC circuit is a vehicle circuit and the actuator is a vehicle actuator.

11. The MRC circuit according to claim 10 wherein the transmitter circuit is separate from the vehicle and the receiver circuit is on the vehicle.

12. A magnetic resonant coupling (MRC) actuation circuit for actuating a device on a vehicle, said MRC circuit comprising:
    a transmitter circuit including a controller, a base coil, a variable current source and a tuning capacitor, said variable current source selectively providing a predetermined alternating current to the base coil in combination with a capacitance provided by the tuning capacitor so as to generate an oscillating magnetic field at a predetermined frequency; and a plurality of receiver circuits each including a shape memory alloy (SMA) actuator and an actuator coil, said controller selectively providing the frequency of the oscillating magnetic field to be separately tuned to the actuator coil in each of the receiver circuits through MRC so as to heat the SMA actuator and cause it to change its configuration, where the controller adjusts the transmitter circuit to fine tune the oscillating magnetic field, based on a change of phase of reflected impedance of each of the receiver circuits, when the SMA actuator changes its configuration.

13. The MRC circuit according to claim 12 wherein each of the receiver circuits includes a variable capacitor in electrical communication with the SMA actuator and the actuator coil.

14. The MRC circuit according to claim 12 wherein the SMA actuator operates both as an inductor and a parasitic capacitance in the receiver circuits.

15. The MRC circuit according to claim 12 wherein the transmitter circuit is separate from the vehicle and the plurality of receiver circuits is on the vehicle.

16. The MRC circuit according to claim 12 wherein the actuator coil of each of the receiver circuits is positioned within a perimeter of the base coil and substantially on a same plane as the base coil.

* * * * *